US011011670B2

(12) United States Patent
Koyanagi

(10) Patent No.: US 11,011,670 B2
(45) Date of Patent: May 18, 2021

(54) OPTICAL DEVICE LAYER TRANSFERRING METHOD

(71) Applicant: DISCO CORPORATION, Tokyo (JP)

(72) Inventor: Tasuku Koyanagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/855,081

(22) Filed: Apr. 22, 2020

(65) Prior Publication Data

US 2020/0343405 A1 Oct. 29, 2020

(30) Foreign Application Priority Data

Apr. 23, 2019 (JP) .............................. JP2019-082146

(51) Int. Cl.
  *H01L 33/00* (2010.01)
  *H01L 25/075* (2006.01)
(52) U.S. Cl.
  CPC ...... *H01L 33/0093* (2020.05); *H01L 25/0753* (2013.01)
(58) Field of Classification Search
  None
  See application file for complete search history.

(56) References Cited

U.S. PATENT DOCUMENTS

| | | | |
|---|---|---|---|
| 10,916,679 B2* | 2/2021 | Koyanagi | ............. H01L 33/007 |
| 2018/0337141 A1* | 11/2018 | Priewasser | ............ H01L 23/562 |
| 2021/0005520 A1* | 1/2021 | Ishio | ................. H01L 21/67288 |

FOREIGN PATENT DOCUMENTS

| | | |
|---|---|---|
| JP | 2004072052 A | 3/2004 |
| JP | 2016021464 A | 2/2016 |
| JP | 2018107421 A | 7/2018 |

* cited by examiner

*Primary Examiner* — Robert K Carpenter
(74) *Attorney, Agent, or Firm* — Greer Burns & Crain Ltd.

(57) ABSTRACT

A transferring method of transferring a plurality of optical device layers includes a transfer member bonding step, a buffer layer breaking step, a first optical device layer transferring step, an adhesive removing step, and a second optical device layer transferring step. In the transfer member bonding step, an optical device wafer and a transfer member are bonded to each other through an adhesive, and each spacing between adjacent ones of the optical device layers of the optical device wafer which each have been divided in a chip size is filled with the adhesive. In the adhesive removing step, at least part of the adhesive with which each spacing between the adjacent ones of the optical device layers has been filled is removed such that the optical device layers which have been embedded in an adhesive layer in the transfer member bonding step project from the adhesive layer.

1 Claim, 6 Drawing Sheets

OPTICAL DEVICE LAYER TRANSFERRING METHOD

BACKGROUND OF THE INVENTION

Field of the Invention

The present invention relates to an optical device layer transferring method which transfers an optical device layer from an optical device wafer.

Description of the Related Art

An optical device such as a light emitting diode (LED) is formed by having an optical device layer including an n-type semiconductor layer and a p-type semiconductor layer which constitute a pn junction stacked over a front surface of a sapphire substrate by epitaxial growth, for example. A separation technique, referred to as a laser lift-off, has been known in which such optical device layer formed in this manner is separated from the sapphire substrate and transferred to a transfer member (see Japanese Patent Laid-Open No. 2004-072052 and Japanese Patent Laid-Open No. 2016-021464). In recent years, a manufacturing technique for an LED having an extremely small size, called a micro LED, has been also developed, and a technique of manufacturing a large number of LEDs by dividing a semiconductor layer by etching has been known (see Japanese Patent Laid-Open No. 2018-107421).

SUMMARY OF THE INVENTION

However, when performing a laser lift-off on the micro LED described above, a transfer rate of transferring each of the LEDs to the transfer member is reduced.

It is therefore an object of the present invention to provide an optical device layer transferring method of transferring an optical device layer from an optical device wafer, the optical device layer transferring method capable of preventing a transfer rate of each optical device to a transfer member from being reduced when performing a laser lift-off.

In accordance with an aspect of the present invention, there is provided a transferring method of transferring a plurality of optical device layers of an optical device wafer, the plurality of optical device layers each being divided in a chip size, the optical device wafer having the plurality of optical device layers stacked on a front surface of an epitaxy substrate through buffer layers. The transferring method includes a transfer member bonding step, a buffer layer breaking step, a first optical device layer transferring step, an adhesive removing step, and a second optical device layer transferring step. The transfer member bonding step is a step of bonding the optical device wafer and a transfer member to each other through an adhesive, and filling each spacing between the adjacent ones of the optical device layers of the optical device wafer which each have been divided in a chip size with the adhesive. The buffer layer breaking step is a step of applying a pulsed laser beam having a transmission wavelength to the epitaxy substrate and an absorption wavelength to the buffer layers, to the buffer layers from a back surface of the epitaxy substrate of the optical device wafer to which the transfer member is bonded to thereby break the buffer layers, after the transfer member bonding step is carried out. The first optical device layer transferring step is a step of separating the epitaxy substrate from the optical device layers to thereby transfer the optical device layers which have been stacked on the epitaxy substrate to the transfer member, after the buffer layer breaking step is carried out. The adhesive removing step is a step of removing at least part of the adhesive with which each spacing between the adjacent ones of the optical device layers has been filled such that the optical device layers which have been embedded in an adhesive layer in the transfer member bonding step project from the adhesive layer, after the optical device layer transferring step is carried out. The second optical device layer transferring step is a step of transferring the optical device layers projecting from the adhesive layer to a mounting substrate, after the adhesive removing step is carried out.

According to the present invention, it is possible to suppress reduction in transfer rate of optical device layers to a transfer member upon laser lift-off.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Hereinafter, a detailed description will be given regarding an embodiment of the present invention with reference to the drawings. The present invention is not limited to contents described in the following embodiment. Also, components described below may include those that can easily be assumed by persons skilled in the art or substantially the same elements as those known in the art. Moreover, configurations described below may be suitably combined. Further, the configurations may be variously omitted, replaced, or changed without departing from the scope of the present invention.

Figure 1:
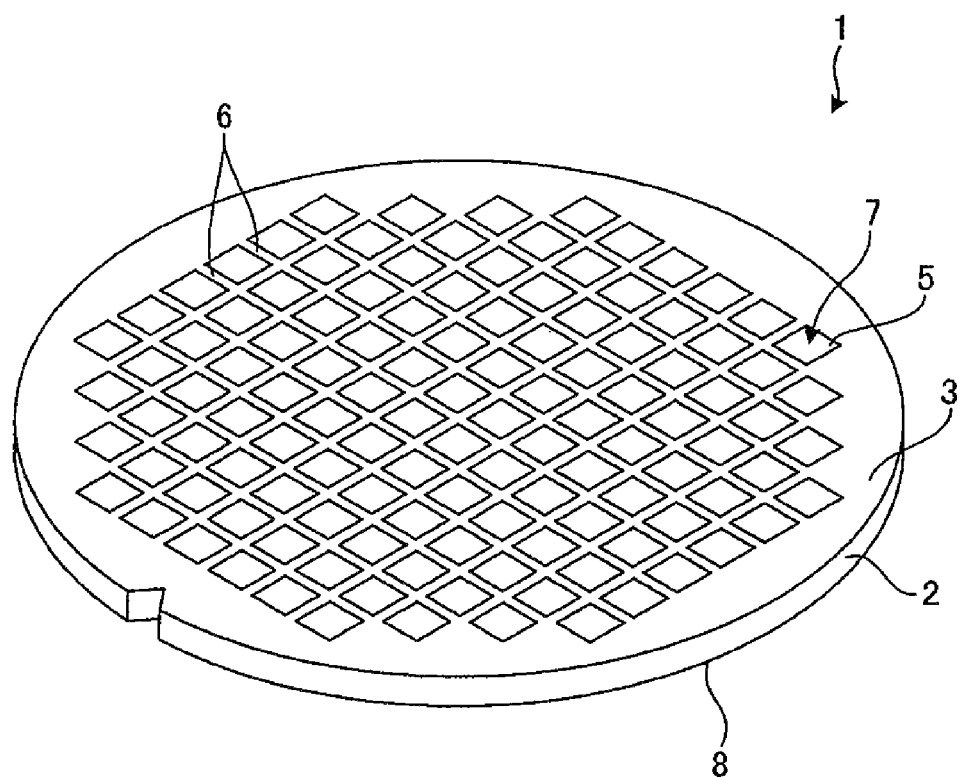
FIG. 1 is a perspective view illustrating an optical device wafer including an object to be transferred in a transferring method according to an embodiment of the present invention.
Figure 2:
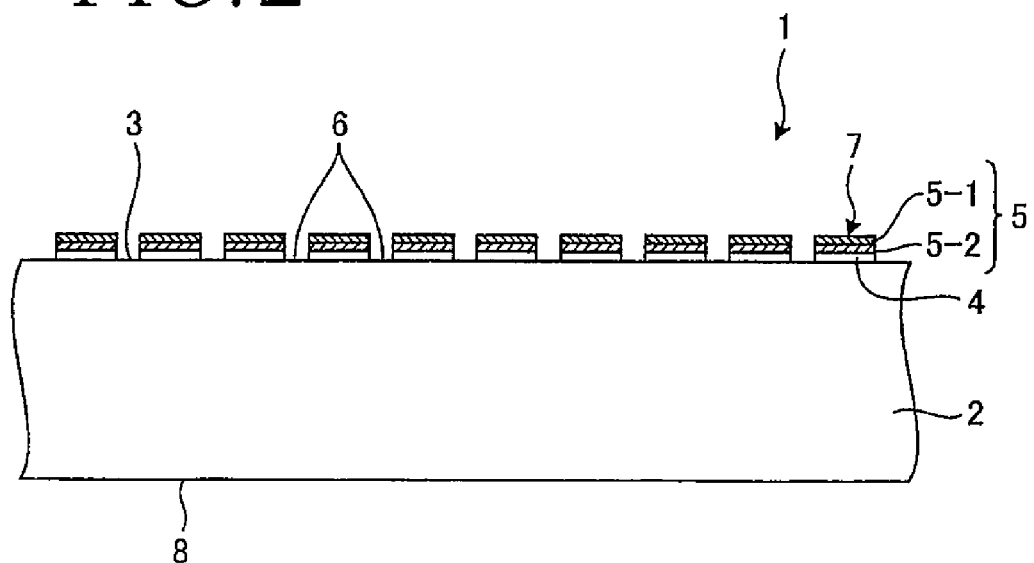
FIG. 2 is a cross-sectional view illustrating the optical device wafer of FIG. 1.

A transferring method according to an embodiment of the present invention will be described in accordance with the drawings. FIG. 1 is a perspective view illustrating an optical device wafer 1 including an object to be transferred in a transferring method according to an embodiment of the present invention. FIG. 2 is a cross-sectional view illustrating the optical device wafer 1 of FIG. 1. Note that, in FIGS. 1 and 2, an optical device layer 5 and the like are schematically illustrated in a larger size than an actual size with respect to the optical device wafer 1, for description of the present embodiment, and other drawings subsequent to FIGS. 1 and 2 are likewise illustrated. As illustrated FIG. 2, the optical device wafer 1 includes an epitaxy substrate 2, and an optical device layer 5 which is stacked on a front surface 3 of the epitaxy substrate 2 with a buffer layer 4 interposed therebetween.

In the present embodiment, the epitaxy substrate 2 is a sapphire substrate having a disc shape with substantially two inches (approximately 50 mm) in diameter and substantially 300 μm in thickness. In the present embodiment, as illustrated in FIG. 2, the optical device layer 5 includes an n-type gallium nitride semiconductor layer 5-1 and a p-type gallium nitride semiconductor layer 5-2 which are formed on the front surface 3 of the epitaxy substrate 2 by epitaxial growth so as to have a total thickness of substantially 6 μm. More specifically, the p-type gallium nitride semiconductor layer 5-2 is formed on the front surface 3 of the epitaxy substrate 2 through the buffer layer 4 by epitaxial growth, and the n-type gallium nitride semiconductor layer 5-1 is then formed on the p-type gallium nitride semiconductor layer 5-2 by epitaxial growth. For example, the optical device layer 5 described above is used as an LED. The buffer layer 4 is a gallium nitride (GaN) layer with a thickness of substantially 1 μm and formed between the front surface 3 of the epitaxy substrate 2 and the p-type gallium nitride semiconductor layer 5-2 of the optical device layer 5 upon stacking the optical device layer 5 on the front surface 3 of the epitaxy substrate 2.

In the present embodiment, as illustrated in FIG. 1, the optical device layer 5 thus stacked on the front surface 3 of the epitaxy substrate 2 is partitioned by a plurality of crossing streets 6 in a grid pattern to define a plurality of respective regions where a plurality of optical devices 7 (a plurality of optical device layers 5) are formed each being divided in a chip size. Each spacing between adjacent ones of the optical device layers 5, in other words, each spacing between the adjacent ones of the optical devices 7 is equal to a width of each of the streets 6 and is substantially 5 μm in the present embodiment. In addition, a size of the optical device layer 5, that is, a size of the optical device 7 is equal to each spacing between adjacent ones of the streets 6 and is equal to or larger than 10 μm and equal to or smaller than 20 μm in the present embodiment. More specifically, the optical device layers 5 are configured such that substantially two million optical devices 7 to be each used as a micro LED are formed in the epitaxy substrate 2 having a diameter of two inches in the present embodiment.

Figure 3:
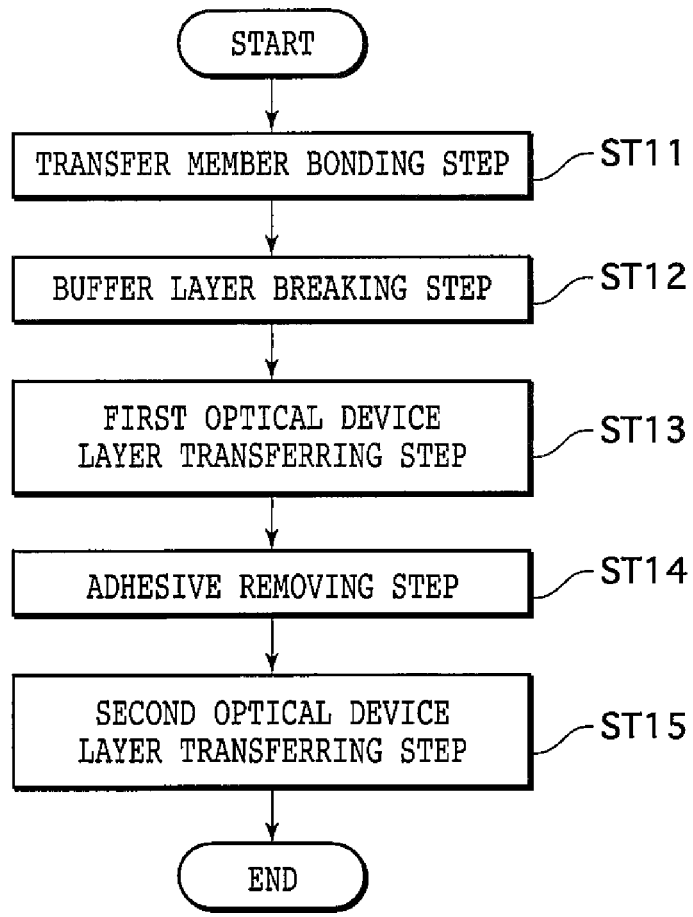
FIG. 3 is a flow chart illustrating the transferring method according to an embodiment of the present invention.

Next, a transferring method according to the present embodiment will be described. FIG. 3 is a flow chart illustrating the transferring method according to the embodiment of the present invention. The transferring method is a method of transferring the optical device layers 5 of the optical device wafer 1 and includes a transfer member bonding step ST11, a buffer layer breaking step ST12, a first optical device layer transferring step ST13, an adhesive removing step ST14, and a second optical device layer transferring step ST15, as illustrated in FIG. 3.

Figure 4:
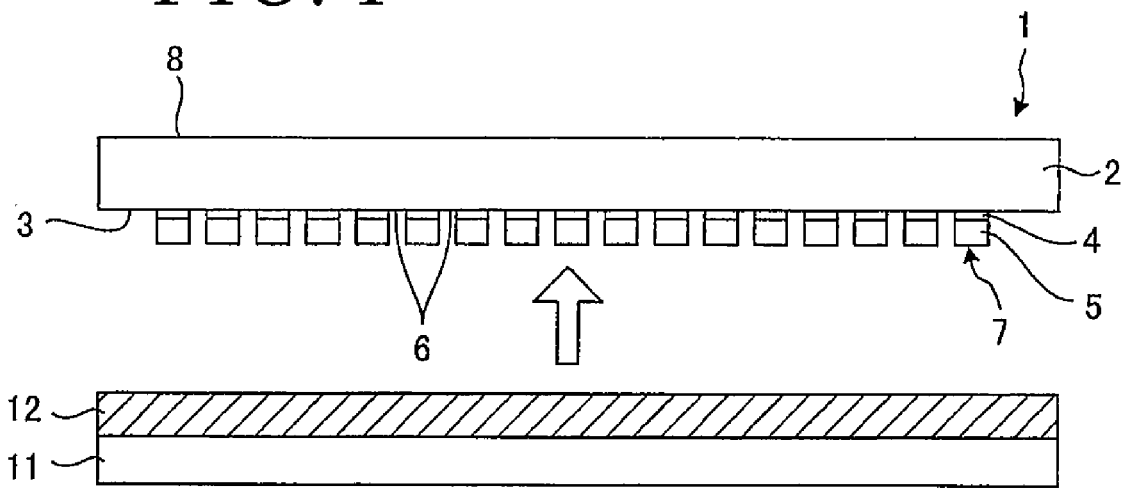
FIG. 4 is a cross-sectional view illustrating a state in a transfer member bonding step in FIG. 3.
Figure 5:
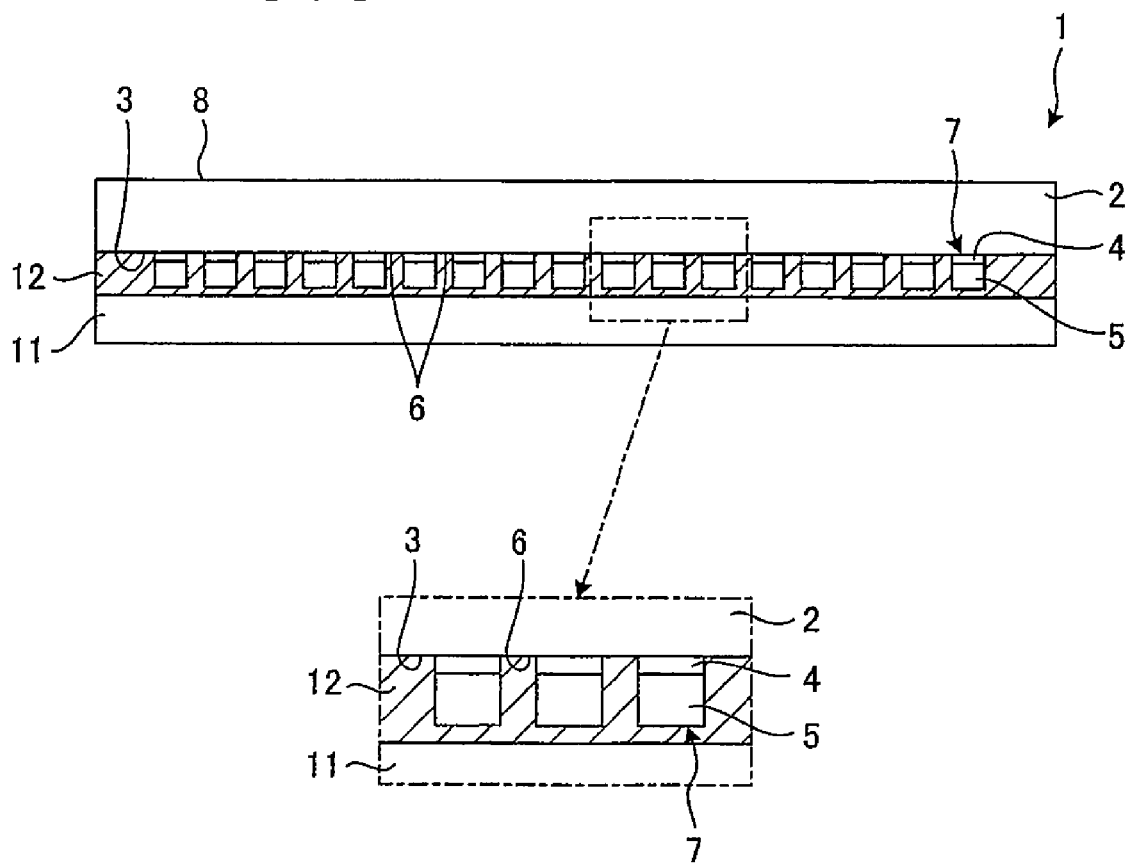
FIG. 5 is a cross-sectional view illustrating a state subsequent to FIG. 4 where the transfer member bonding step in FIG. 3 is carried out.

FIG. 4 is a cross-sectional view illustrating a state in the transfer member bonding step ST11 in FIG. 3. FIG. 5 is a cross-sectional view illustrating a state subsequent to FIG. 4 where the transfer member bonding step ST11 in FIG. 3 is carried out. As illustrated in FIGS. 4 and 5, the transfer member bonding step ST11 is a step of bonding the optical device wafer 1 and a transfer member 11 through adhesive 12 and filling the spacing between the adjacent ones of the optical device layers 5 of the optical device wafer 1 which each have been divided into a chip size with the adhesive 12.

In the transfer member bonding step ST11, specifically, as illustrated in FIG. 4, first, a transfer substrate having a size similar to the epitaxy substrate 2 as the transfer member 11 is prepared, and the adhesive 12 is applied on one surface of the transfer member 11, the adhesive 12 having a volume equal to or higher than a total volume of the streets 6 corresponding to the spacings between the adjacent ones of the optical device layers 5.

Note that the transfer member 11 adopts a glass substrate having a thickness of substantially 0.3 mm nearly equal to the epitaxy substrate 2 as a preferable substrate in the present embodiment. However, the present invention is not limited to this. As long as the transfer member 11 can be bonded to the adhesive 12 containing organic compounds, it is possible to use a substrate formed of various other materials, such as a metal substrate.

In addition, the adhesive 12 preferably adopts one which contains the organic compounds, for example, a glue to be used for an adhesive tape. The adhesive 12 is softened by heating, thereby reducing its viscosity. When the adhesive 12 is further heated or irradiated with an ultraviolet ray, chemical reaction such as curing reaction occurs, and then, the adhesive 12 is cured, thereby further reducing its viscosity.

In the transfer member bonding step ST11, next, the optical device layers 5 stacked on the front surface 3 of the epitaxy substrate 2 is made to be opposed to the adhesive 12 applied to the transfer member 11, and the optical device layers 5 and the adhesive 12 come close to each other and then in contact with each other. Further, in the transfer member bonding step ST11, by pressing a back surface 8 side which is a surface opposite to the front surface 3 of the epitaxy substrate 2 toward the transfer member 11 or pressing a surface of the transfer member 11 opposite to a side thereof to which the adhesive 12 is applied toward to the epitaxy substrate 2, the adhesive 12 is deformed along an outline of the optical device layers 5 such that the optical device layers 5 are fully embedded in the adhesive 12 as illustrated in FIG. 5. In this manner, in the transfer member bonding step ST11, each of the spacings between the adjacent ones of the optical device layers 5 of the optical device wafer 1, each of the optical device layers 5 having been divided in a chip size, are filled with the adhesive 12.

Thus, the stronger a pressing force is to such an extent that the optical device wafer 1 and the transfer member 11 are not broken, the more preferable in the transfer member bonding step ST11. In this case, when the adhesive 12 is more preferably deformed along the outline of the optical device layers 5, it is possible to fill each of the spacings between the adjacent ones of the optical device layers 5 more preferably. In addition, in the transfer member bonding step ST11, it is preferable to heat the adhesive 12 from the back surface 8 of the epitaxy substrate 2 or from the surface of the transfer member 11 opposite to the side thereof to which the adhesive 12 is applied, to such an extent that the adhesive 12 does not have chemical reaction such as curing reaction generated. In this case, since the adhesive 12 reduces its viscosity due to heat, if the adhesive 12 is deformed along the outline of the optical device layers 5 more preferably, it is possible to fill each of the spacings between the adjacent ones of the optical device layers 5 more preferably.

Figure 6:
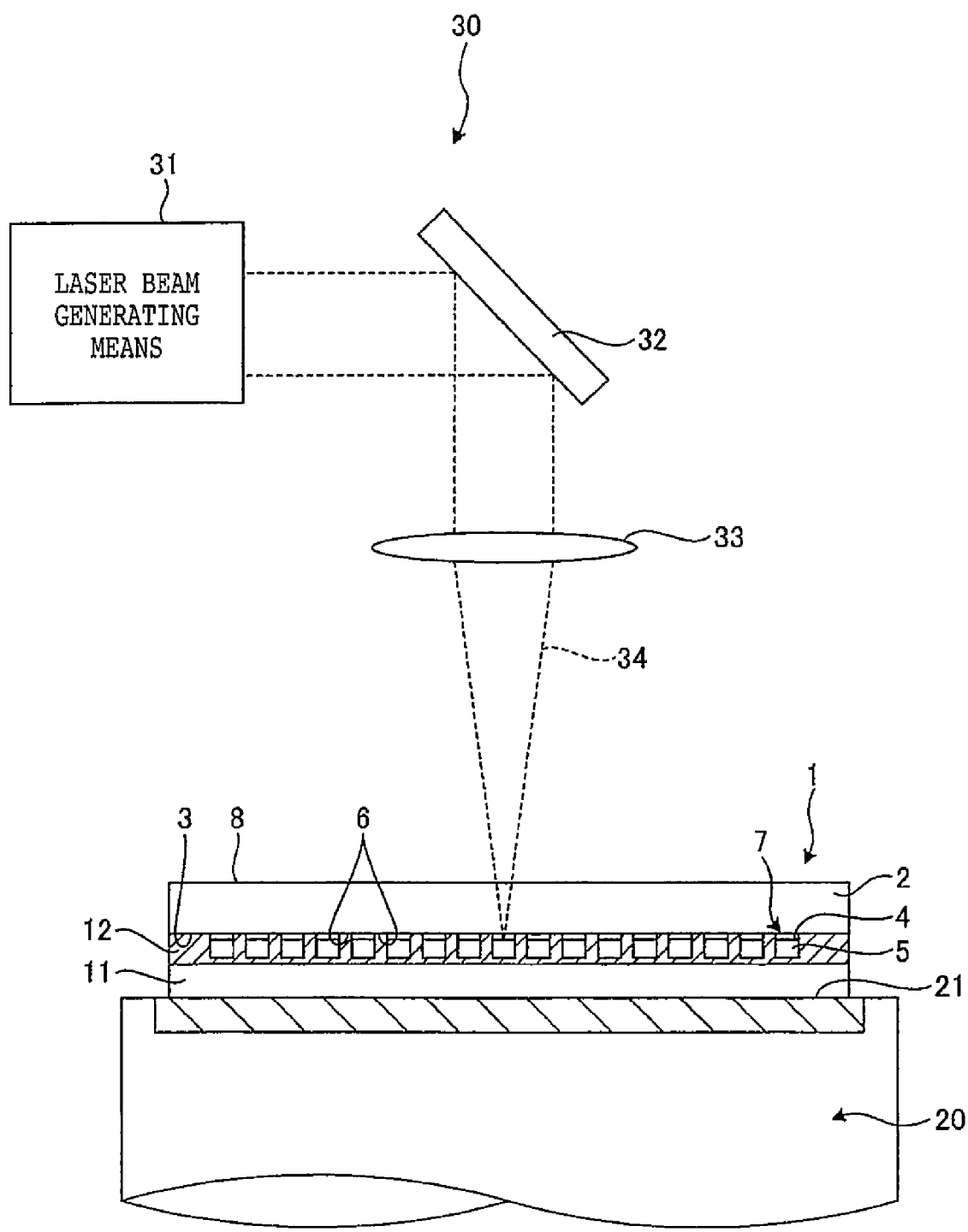
FIG. 6 is a partial cross-sectional side view illustrating an example of a buffer layer breaking step in FIG. 3.

FIG. 6 is a partial cross-sectional side view illustrating an example of a buffer layer breaking step ST12 in FIG. 3. As illustrated in FIG. 6, in the buffer layer breaking step ST12, after the transfer member bonding step ST11 is carried out, a pulsed laser beam 34 having a transmission wavelength to the epitaxy substrate 2 and an absorption wavelength to the buffer layer 4 is applied to the buffer layer 4 from the back surface 8 of the epitaxy substrate 2 of the optical device wafer 1 to which the transfer member 11 is bonded, and then breaks the buffer layer 4.

In the buffer layer breaking step ST12, specifically, as illustrated in FIG. 6, first, a surface of a bonded unit on the transfer member 11 side, the bonded unit being obtained by bonding the optical device wafer 1 and the transfer member 11 in the transfer member bonding step ST11, is sucked and held on a holding surface 21 of a chuck table 20 which is connected to a vacuum source not illustrated.

In the buffer layer breaking step ST12, next, a laser beam applying unit 30 applies the pulsed laser beam 34 having a transmission wavelength to the epitaxy substrate 2 and an absorption wavelength to the buffer layer 4, to the buffer layer 4 from the back surface 8 side of the epitaxy substrate 2 in the bonded unit including the optical device wafer 1 and the transfer member 11, the bonded unit being held on the chuck table 20. As a result, the buffer layer 4 is broken. In the buffer layer breaking step ST12, in the present embodiment, application of the pulsed laser beam 34 is carried out on the entire surface of the epitaxy substrate 2. However, the present invention is not limited to this. Alternatively, application of the pulsed laser beam 34 may be applied to the epitaxy substrate 2 only at a location where the buffer layer 4 is formed.

Here, as illustrated in FIG. 6, the laser beam applying unit 30 generates the above-mentioned pulsed laser beam 34 having a predetermined wavelength described above by laser beam generating means 31, and causes an optical mirror 32 to change an orientation of the pulsed laser beam 34 from the laser beam generating means 31 to a direction perpendicular to the back surface 8 of the epitaxy substrate 2 of the bonded unit held on the chuck table 20 to focus the pulsed laser beam 34 from the optical mirror 32 through a focusing lens 33, thereby adjusting a spot diameter and defocus of the pulsed laser beam 34. Accordingly, application condition of the pulsed laser beam 34 in the buffer layer breaking step ST12 is adjusted.

In the buffer layer breaking step ST12, for example, as the pulsed laser beam 34, used is an ultraviolet laser beam having a wavelength of approximately 257 nm with a repetition frequency being equal to or greater than 50 kHz and equal to or less than 200 kHz, an average power being equal to or greater than 0.1 W and equal to or less than 2.0 W, and a pulse width being equal to or less than 20 ps. In addition, the pulsed laser beam 34 is adjusted to have a spot diameter equal to or greater than 10 μm and equal to or less than 50 μm, and the defocus is adjusted to approximately 1.0 mm. In this manner, a breaking process of the buffer layer 4 is carried out.

Figure 7:
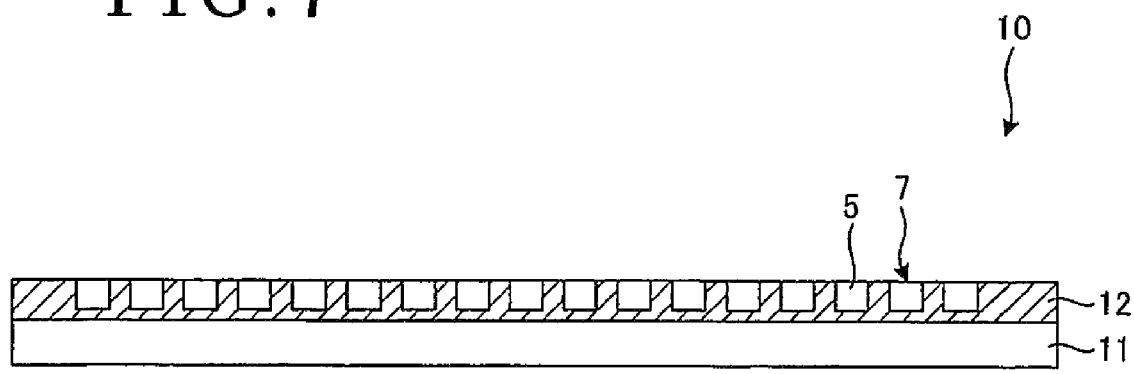
FIG. 7 is a cross-sectional view illustrating an example of a first optical device layer transferring step in FIG. 3.

FIG. 7 is a cross-sectional view illustrating an example of a first optical device layer transferring step ST13 in FIG. 3. After the buffer layer breaking step ST12 is carried out, in the first optical device layer transferring step ST13, the epitaxy substrate 2 is separated from the optical device layers 5, and accordingly, the optical device layers 5 stacked on the epitaxy substrate 2 are transferred to the transfer member 11.

Specifically, in the first optical device layer transferring step ST13, ultrasonic vibration is applied to the bonded unit from the back surface 8 side of the epitaxy substrate 2 of the bonded unit whose buffer layer 4 has been broken in the buffer layer breaking step ST12, from a horn in which ultrasonic vibration means not illustrated is disposed. Accordingly, with the buffer layer 4 which has been broken as a trigger for separation, the epitaxy substrate 2 is separated from the optical device layers 5, and the optical device layers 5 are transferred to the transfer member 11.

In this manner, what is generally called a laser lift-off by the buffer layer breaking step ST12 and the first optical device layer transferring step ST13 is carried out, and accordingly, the optical device layers 5 (optical devices 7) are embedded in the adhesive 12 formed by being applied to the one surface of the transfer member 11 to thereby be transferred thereto, thereby obtaining an optical device layer transfer substrate 10 illustrated in FIG. 7.

Figure 8:
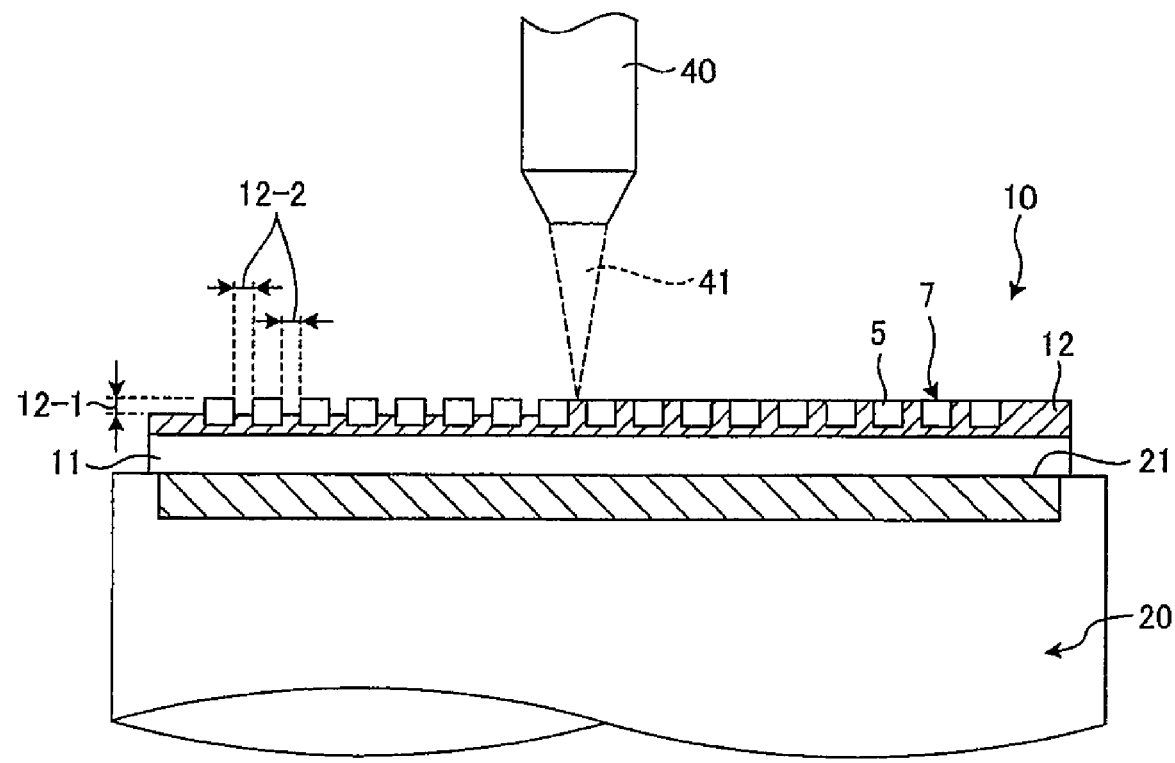
FIG. 8 is a partial cross-sectional side view illustrating an example of an adhesive removing step in FIG. 3.

FIG. 8 is a partial cross-sectional side view illustrating an example of an adhesive removing step ST14 in FIG. 3. As illustrated in FIG. 8, after the first optical device layer transferring step ST13 is carried out, the adhesive removing step ST14 is a step of removing at least part of the adhesive 12 with which the spacings between the adjacent ones of optical device layers 5 have been filled such that the optical device layers 5 which have been embedded in an adhesive layer serving as a layer of the adhesive 12 in the transfer member bonding step ST11 project from the adhesive layer.

Specifically, in the adhesive removing step ST14, first, as illustrated in FIG. 6, a surface on the transfer member 11 side of the optical device layer transfer substrate 10 obtained in the first optical device layer transferring step ST13 is sucked and held on the holding surface 21 of the chuck table 20. Next, in the adhesive removing step ST14, alignment for positioning between the optical device layer transfer substrate 10 held on the holding surface 21 of the chuck table 20 and an application position of the laser beam 41 by a laser beam applying unit 40 is performed.

Note that the laser beam applying unit 40 to be used in the adhesive removing step ST14 and the laser beam applying unit 30 to be used in the buffer layer breaking step ST12 are different from each other, in the present embodiment. However, the present invention is not limited to this, and the same laser beam applying unit may be used in the buffer layer breaking step ST12 and the adhesive removing step ST14.

Next, in the adhesive removing step ST14, without applying the laser beam 41 to the optical device layers 5 (optical devices 7) from the adhesive 12 side in the optical device layer transfer substrate 10 to which the optical device layers 5 (optical devices 7) are transferred, the laser beam 41 is applied to at least part of the adhesive 12 between the adjacent ones of the optical device layers 5 (optical devices 7), whereby laser ablation processing is selectively carried out on the adhesive 12 to be thereby removed.

In the adhesive removing step ST14, for example, the laser beam 41 adopts a laser beam from an ultraviolet region to a visible light region with a repetition frequency being equal to or greater than 100 kHz and equal to or less than 1000 kHz, an average power being equal to or greater than 0.2 W and equal to or less than 1.5 W, and a wavelength being in a range of equal to or greater than approximately 257 nm and equal to or less than approximately 515 nm. In addition, a spot diameter of the laser beam 41 is decreased to equal to or greater than 0.5 μm and equal to or less than 3 μm. By scanning the adhesive 12 with such laser beam 41 at a scanning speed of equal to or greater than 100 mm/s and equal to or less than 600 mm/s, the removing process of the adhesive 12 is carried out.

In the adhesive removing step ST14, it is preferable to set a removed thickness 12-1 of the adhesive 12 to be a half or larger than a thickness of the optical device layer 5 (optical device 7). In this case, in the second optical device layer transferring step ST15 described later, it is possible to preferably pick up the optical device layers 5 (optical devices 7) from the adhesive 12. Note that, in the adhesive removing step ST14, the removed thickness 12-1 of the adhesive 12 is preferably set smaller than a depth at which to reach the transfer member 11. In this case, it is possible to suppress a possibility of carrying out laser ablation on the transfer member 11 with the laser beam 41.

In addition, in the adhesive removing step ST14, the removed thickness 12-1 of the adhesive 12 is preferably set to a predetermined range, more preferably set to a fixed value. In these cases, in the second optical device layer transferring step ST15 described later, it is possible to stably pick up the optical device layers 5 (optical devices 7) from the adhesive 12 with a force in a predetermined range.

In the present embodiment, a region in which the optical device layers 5 (optical devices 7) are transferred is a scale of equal to or greater than 10 μm and or equal to or less than 20 μm, and a region in which the adhesive 12 is exposed is a scale of substantially 5 μm which is the same as a width of each of the streets 6. The removed thickness 12-1 of the adhesive 12 is a scale of substantially 3 μm which is substantially half the thickness of the optical device layer 5 (optical device 7). In the adhesive removing step ST14, laser ablation processing is carried out with the laser beam 41, and accordingly, it is possible to control a removed region 12-2 and the removed region 12-1 of the adhesive 12 in units of micrometer as with the present embodiment.

In the present embodiment, the region in which the optical device layers 5 (optical devices 7) are transferred and the region in which the adhesive 12 is exposed are arrayed cyclically. In view of this, in the adhesive removing step ST14, it is preferable to remove the adhesive 12 by what is generally called a Hasen Cut (registered trademark) by which laser ablation is carried out by repetitively switching ON and OFF of the laser beam 41 in a set cycle or by scanning with the laser beam 41, for example, by use of scanning means including a galvo scanner, a resonant scanner, an acousto-optical deflection device, polygon mirror, or the like. In adhesive removing step ST14, specifically, the laser beam 41 is applied being switched ON and OFF repetitively. For example, the laser beam 41 is applied in an ON state to the region in which the adhesive 12 is exposed, while passing through the region in which optical device layers 5 (optical devices 7) are transferred, in an OFF state.

Figure 9:
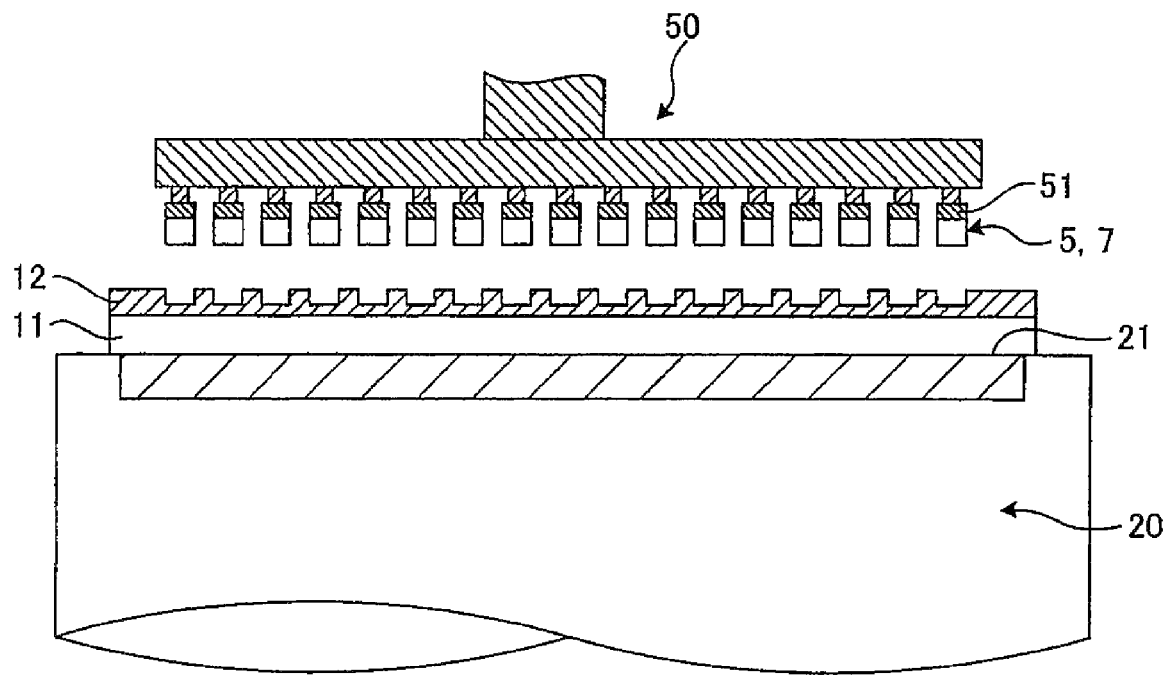
FIG. 9 is a cross-sectional view illustrating a state in a second optical device layer transferring step in FIG. 3.
Figure 10:
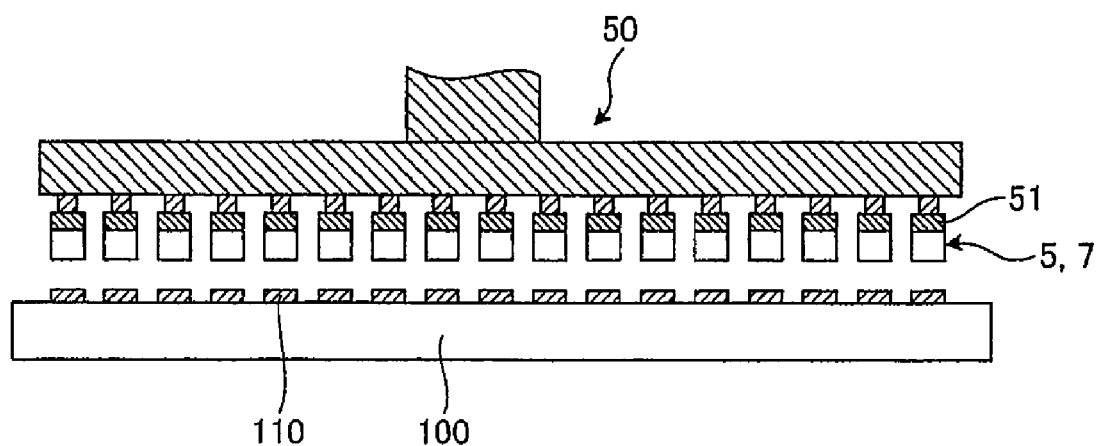
FIG. 10 is a cross-sectional view illustrating a state subsequent to FIG. 9 where the second optical device layer transferring step in FIG. 3 is carried out.

FIG. 9 is a cross-sectional view illustrating a state in the second optical device layer transferring step ST15 in FIG. 3. FIG. 10 is a cross-sectional view illustrating a state subsequent to FIG. 9 where the second optical device layer transferring step ST15 in FIG. 3 is carried out. The second optical device layer transferring step ST15 is a step of transferring the optical device layers 5 which project from the adhesive layer to a mounting substrate 100 after the adhesive removing step ST14 is carried out, as illustrated in FIGS. 9 and 10.

Specifically, in the second optical device layer transferring step ST15, first, before each of the optical device layers 5 (optical devices 7) is picked up with each of pickup sections 51 provided in a pickup unit 50 which is arranged at a position at which to face each of the optical device layers 5 (optical devices 7), it is preferable to carry out an adhesion reduction process for reducing the adhesion of the adhesive 12 which supports the optical device layers 5 (optical devices 7). For example, the adhesion reduction process is a process for reducing the adhesion of the adhesive 12 by heating the adhesive 12 or by causing curing reaction such as polymerization reaction due to application of ultraviolet ray to the adhesive 12 or further application of heat thereto. The adhesion reduction process makes it possible to pick up the optical device layers 5 (optical devices 7) by the pickup unit 50 with a lower force, enhance a possibility of picking up the optical device layers 5 (optical devices 7), and reduces and suppresses a risk of the adhesive 12 remaining on the optical device layers 5 (optical devices 7).

Next, in the second optical device layer transferring step ST15, as illustrated in FIG. 9, each of the pickup section 51 of the pickup unit 50 grips or holds under suction each of the optical device layers 5 (optical devices 7) to pick up. Thereafter, in the second optical device layer transferring step ST15, as illustrated in FIG. 10, each of the optical device layers 5 (optical devices 7) which is picked up by each of the pickup section 51 of the pickup unit 50 is moved directly above each of bonding layers 110 on the mounting substrate 100, each of the bonding layers 110 being provided in a shape and a size same as each of the optical device layers 5 (optical devices 7) such that adjacent ones of the bonding layers 110 are arrayed at an interval same as that of the adjacent ones of the optical device layers 5 (optical devices 7), and then, each of the optical device layers 5 (optical devices 7) is placed on each of the bonding layers 110.

Each of the optical device layers 5 (optical devices 7) which has been transferred on each of the bonding layers 110 on the mounting substrate 100 in the second optical device layer transferring step ST15 is bonded to the mounting substrate 100 through each of the bonding layers 110 to be mounted on the mounting substrate 100.

In this manner, in the second optical device layer transferring step ST15, in the present embodiment, each of the pickup section 51 of the pickup unit 50 transfers each of the optical device layers 5 (optical devices 7) which projects from the adhesive 12 all at once, and accordingly, it is possible to transfer the optical device layers 5 (optical devices 7) effectively. Note that the present invention is not limited to this. Alternatively, a single pickup section 51 may transfer each of the optical device layers 5 (optical devices 7) which projects from the adhesive 12 to the mounting substrate 100 one by one, and in this case, it is possible to enhance a transfer accuracy of each of the optical device layers 5 (optical devices 7).

In the transferring method of transferring the optical device layers 5 of the optical device wafer 1 according to the present embodiment, each spacing between the adjacent ones of the optical device layers 5 of the optical device wafer 1 which each have been divided in a chip size is filled with the adhesive 12, so that the optical device wafer 1 and the transfer member 11 are bonded to each other through the adhesive 12 in the transfer member bonding step ST11, providing an advantageous effect that reduction of the transfer rate of transferring the optical devices 7 (optical device layers 5) to the transfer member 11 is suppressed.

In addition, in the transferring method of transferring the optical device layers 5 of the optical device wafer 1 according to the present embodiment, at least part of the adhesive 12 with which each spacing between the adjacent ones of the optical device layers 5 is filled is removed in the adhesive removing step ST14, and accordingly, the optical device layers 5 which have been embedded in the adhesive layer in the transfer member bonding step ST11 is caused to project from the adhesive layer, thereby providing an advantageous effect that reduction of a transfer efficiency of transferring the optical device layers 5 (optical devices 7) to the mounting substrate 100 and the transfer accuracy thereof is suppressed.

A transferring method according to modification examples of the embodiment of the present invention will be described below. The transferring method according to the modification examples is the same as the above-described embodiment except that the adhesive removing step ST14 is different.

The adhesive removing step ST14 according to the modification examples selectively removes the adhesive 12 by etching or scriber processing in place of application of the laser beam 41 according to the above-described embodiment.

In the adhesive removing step ST14 according to one of the modification examples, for example, the adhesive 12 is removed by causing chemical reaction with the adhesive 12, and etchant containing liquid compounds or gaseous compounds which rarely generate notable chemical reaction with the optical device layer 5 is supplied to the optical device layers 5 and the adhesive 12, thereby selectively removing the adhesive 12 by etching.

In addition, in the adhesive removing step ST14 according to another one of the modification examples, for example, with use of a scriber as a tool made of a metal or diamond, a tip end of the scriber having the same diameter as the width of the exposed region of the adhesive 12 and of each of the streets 6 or a diameter of substantially several micrometers which is smaller than the width of the exposed region of the adhesive 12 and of each of the streets 6, the exposed region of the adhesive 12 is scraped along each of the streets 6, so that the adhesive 12 is selectively removed by the scriber processing.

The transferring method of transferring the optical device layers 5 of the optical device wafer 1 according to these modification examples provides the same advantageous effect as the transferring method of transferring the optical device layers 5 of the optical device wafer 1 according to the embodiment.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A transferring method of transferring a plurality of optical device layers of an optical device wafer, the plurality of optical device layers each being divided in a chip size, the optical device wafer having the plurality of optical device layers stacked on a front surface of an epitaxy substrate through buffer layers, the transferring method comprising:

a transfer member bonding step of bonding the optical device wafer and a transfer member to each other through an adhesive, and filling each spacing between the adjacent ones of the optical device layers of the optical device wafer which each have been divided in a chip size with the adhesive;

a buffer layer breaking step of applying a pulsed laser beam having a transmission wavelength to the epitaxy substrate and an absorption wavelength to the buffer layers, to the buffer layers from a back surface of the epitaxy substrate of the optical device wafer to which the transfer member is bonded to thereby break the buffer layers, after the transfer member bonding step is carried out;

a first optical device layer transferring step of separating the epitaxy substrate from the optical device layers to thereby transfer the optical device layers which have been stacked on the epitaxy substrate to the transfer member, after the buffer layer breaking step is carried out;

an adhesive removing step of removing at least part of the adhesive with which each spacing between the adjacent ones of the optical device layers has been filled such that the optical device layers which have been embedded in an adhesive layer in the transfer member bonding step project from the adhesive layer, after the optical device layer transferring step is carried out; and a second optical device layer transferring step of transferring the optical device layers projecting from the adhesive layer to a mounting substrate, after the adhesive removing step is carried out.

\* \* \* \* \*